United States Patent
Spivack et al.

(10) Patent No.: US 7,179,988 B2
(45) Date of Patent: Feb. 20, 2007

(54) DYE SENSITIZED SOLAR CELLS HAVING FOIL ELECTRODES

(75) Inventors: James L. Spivack, Cobleskill, NY (US); John Yupeng Gui, Niskayuna, NY (US); Reed Roeder Corderman, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 571 days.

(21) Appl. No.: 10/316,318

(22) Filed: Dec. 11, 2002

(65) Prior Publication Data

US 2004/0115858 A1    Jun. 17, 2004

(51) Int. Cl.
*H01L 31/00*    (2006.01)
(52) U.S. Cl. ...................... 136/263; 136/256
(58) Field of Classification Search ........ 136/263, 136/243–265
See application file for complete search history.

(56) References Cited

U.S. PATENT DOCUMENTS

| | | | |
|---|---|---|---|
| 5,482,570 A * | 1/1996 | Saurer et al. ............. | 136/255 |
| 5,538,620 A * | 7/1996 | Nikolskaja ............... | 205/782 |
| 6,252,156 B1 * | 6/2001 | Ono et al. ................ | 136/256 |
| 6,538,194 B1 * | 3/2003 | Koyanagi et al. ......... | 136/256 |
| 6,649,824 B1 * | 11/2003 | Den et al. ................ | 136/256 |
| 6,852,920 B2 * | 2/2005 | Sager et al. .............. | 136/263 |
| 6,878,871 B2 * | 4/2005 | Scher et al. .............. | 136/252 |

FOREIGN PATENT DOCUMENTS

| JP | 20012823944 | * 10/2001 |
|---|---|---|
| WO | WO 99/63614 | * 12/1999 |

OTHER PUBLICATIONS

U.S. Appl. No. 60/390,904, filed Jun. 22, 2002.*
U.S. Appl. No. 60/421,353.*

* cited by examiner

Primary Examiner—Nam Nguyen
Assistant Examiner—Jeffrey Barton
(74) Attorney, Agent, or Firm—Fletcher Yoder

(57) ABSTRACT

A solar cell having foil electrodes. Specifically, a metal foil is implemented to form electrodes providing a reduced electron path from a dye-sensitized semiconductor material to the electrodes. In one embodiment, nanowires extending from the substrate on which the solar cell is formed are provided. In another embodiment, cavities are formed in a sheet of conductive foil by oxidation, thereby forming a semiconductive material. The semiconductive material is sensitized with a dye and an electrolyte solution is disposed in the cavities, thereby forming an array of dye-sensitized solar cells.

12 Claims, 3 Drawing Sheets

DYE SENSITIZED SOLAR CELLS HAVING FOIL ELECTRODES

CROSS-REFERENCE TO RELATED APPLICATIONS

The following commonly owned applications and patents are hereby incorporated by reference for all purposes:

U.S. patent application Ser. No. 10/316,317, filed concurrently herewith, entitled "Structured Dye Sensitized Solar Cell" by James L. Spivack and Harish R. Acharya, now U.S. Pat. No. 7,019,209;

U.S. patent application Ser. No. 10/316,519, filed concurrently herewith, entitled "Structured Micro-Channel Semiconductor Electrode For Photovoltaic Cells" James L. Spivack and Donald F. Foust, now U.S. Pat. No. 7,078,613; and U.S. patent application Ser. No. 10/316,498, filed concurrently herewith, entitled "Dye Sensitized Solar Cell Having Finger Electrodes" by James L. Spivack, Harish R. Acharya, and Donald F. Foust.

BACKGROUND OF THE INVENTION

Generally speaking, photovoltaic systems are implemented to convert light energy into electricity for a variety of applications. Power production by photovoltaic systems may offer a number of advantages over conventional systems. These advantages may include, but are not limited to, low operating costs, high reliability, modularity, low construction costs, and environmental benefits. As can be appreciated, photovoltaic systems are commonly known as "solar cells," so named for their ability to produce electricity from sunlight.

Conventional solar cells convert light into electricity by exploiting the photovoltaic effect that exists at semiconductor junctions. Accordingly, conventional solar cells generally implement semiconductor layers to produce electron current. The semiconductor layers generally absorb incoming light to produce excited electrons. In addition to the semiconductor layers, solar cells generally include a glass cover or other encapsulant, an anti-reflective layer, a front contact electrode to allow the electrons to enter a circuit, and a back contact electron to allow the electrons to complete the circuit when excited electrons are injected into the semiconductor layer due to light exposure.

One particular type of solar cell is a dye-sensitized solar cell. A dye-sensitized solar cell generally uses an organic dye to absorb incoming light to produce excited electrons. The dye sensitized solar cell generally includes two planar conducting electrodes arranged in a sandwich configuration. A dye-coated semiconductor film separates the two electrodes which may comprise glass coated with a transparent conducting oxide (TCO) film, for example. The semiconductor layer is porous and has a high surface area thereby allowing sufficient dye to be attached as a molecular monolayer on its surface to facilitate efficient light absorption. The remaining intervening space between the electrodes and the pores in the semiconductor film (which acts as a sponge) is filled with an organic electrolyte solution containing an oxidation/reduction couple, such as triiodide/iodide, for example.

One exemplary technique for fabricating a dye-sensitized solar cell is to coat a conductive glass plate with a semiconductor film such as titanium oxide ($TiO_2$) or zinc oxide (ZnO), for example. The semiconductor film is saturated with a dye and a single layer of dye molecules self-assembles on each of the particles in the semiconductor film, thereby "sensitizing" the film. To complete the solar cell, a liquid electrolyte solution containing triiodide/iodide is introduced into the semiconductor film. The electrolyte fills the pores and openings left in the dye-sensitized semiconductor film. To complete the solar cell a second planar electrode with low overpotential for triiodide reduction is implemented to provide a structure having a dye-sensitized semiconductor and electrolyte composite sandwiched between two counter-electrodes.

Conventional dye sensitized solar cells may be fabricated using planar layered structures, as set forth above. The absorption of light by the dye excites electrons in the dye which are injected into the semiconductor film. The electrons travel through the semiconductor film by a "random walk" through the adjacent crystals of the film towards one electrode, while oxidized dye cations, or ions formed by separation of the electrons in the dye, are reduced by the transfer of electrons from a reduced ion (commonly iodide) in the electrolyte, leading to the production of an oxidized species in the electrolyte (commonly triiodide) that migrates toward the opposite electrode where a catalyst supplies the missing electron to complete the circuit. During the random walk of the electron to the electrode, the electron may travel a significant distance, and the electron may be lost by combining with a component of the electrolyte solution, also known as "recombination." Under irradiation by sunlight the density of electrons in the semiconductor may be very high such that such losses significantly reduce the maximum voltage and therefore the efficiency achievable by the solar cells. It may be advantageous to reduce the likelihood of recombination by reducing the travel path of the electron through the semiconductor and thereby reduce the length of time it takes for the electron to diffuse through the semiconductor to the conductive oxide of the electrode. One technique for reducing the travel distance of the electron is to reduce the thickness of the semiconductor film and thus, the distance the electron has to travel to reach an electrode. Disadvantageously, reduction in the thickness of the semiconductor film may reduce the light absorption in the dye, thereby reducing the efficiency of the solar cell.

Similarly, the oxidant (commonly triiodide ions) created by separation of the electrons travel to the back electrode to complete the circuit. Because the ion may originate from any area of the electrolyte solution that is in contact with the dyed surface of the semiconductor material, the ion may have to travel a long distance (e.g. from the front electrode to the back electrode) through the labyrinth created by the porous structure of the semiconductor material. The electrolyte solution is typically made in an organic solvent. Generally speaking, less volatile solvents with a high boiling point, including ionic liquids, are more viscous and impede the diffusion of ions to the point where the diffusion limits the power output and hence the efficiency of the solar cell. Such solvents may be advantageous in providing cell longevity, especially for cells fabricated on a polymer substrate, because polymer substrates may allow less viscous solvents having a low boiling point to diffuse out of the solar cell over time. Decreasing the travel distance of the ions may advantageously reduce the limitations caused by the slow diffusion of the ions. However, as previously described, reducing the thickness of the semiconductor film may reduce the light absorption potential of the dye.

Thus, while it may be advantageous to increase the thickness of the semiconductor film and thereby the surface area of the film to provide increased light absorption, the thicker the semiconductor film, the greater the distance the electrons and ions may travel to reach an electrode.

Although longer light paths may be desirable to facilitate greater light absorption, the losses due to the increased recombination of the electrons into the semiconductor layer, as well as limits to current caused by slow ion diffusion through the electrolyte in the semiconductor pores, make the increased thickness in the semiconductor film disadvantageous since it may produce a less efficient solar cell.

BRIEF DESCRIPTION OF THE INVENTION

In accordance with one aspect of the present technique, there is provided a solar cell comprising: a first planar electrode comprising a transparent material; a second electrode proximately positioned at a distance from the first electrode and comprising a metal foil portion extending in a direction that is different from the direction of the surface of the first planar electrode; and a porous dye sensitized semiconductor material electrically coupled to the second electrode.

In accordance with another aspect of the present technique, there is provided a solar cell comprising: a first electrode having a planar portion and a plurality of nanowires extending therefrom; a second electrode electrically isolated from the first electrode and positioned approximately parallel to the planar portion of the first electrode; a porous dye sensitized semiconductor layer formed on the surface of the planar portion and the nanowires of the first electrode; and an electrolyte solution disposed on the semiconductor layer.

In accordance with a further aspect of the present technique, there is provided a solar cell comprising: a first electrode comprising a porous dye sensitized semiconductor layer having a plurality of cavities therethrough, wherein each of the plurality of cavities is separated from each adjacent cavity by a wall; a second electrode electrically isolated from the first electrode and positioned approximately perpendicular to the plurality of cavities of the first electrode; and an electrolyte solution disposed in each of the plurality of cavities of the first electrode.

In accordance with a yet another aspect of the present technique, there is provided a method of forming a solar cell comprising the acts of: disposing a conductive layer on a substrate; forming a plurality of nanowires, wherein the nanowires are electrically coupled to the conductive layer and extend from the conductive layer; forming a semiconductive layer on each of the plurality of nanowires and on the conductive layer; covering the semiconductive layer with a dye to form a dye-sensitized semiconductive layer; and disposing an electrolyte solution on the dye-sensitized semiconductive layer.

In accordance with still another aspect of the present technique, there is provided a method of forming a solar cell comprising the acts of: disposing a layer of conductive foil on a substrate; oxidizing the layer of conductive foil to form a semiconductive layer having a plurality of cavities therethrough; covering the semiconductive layer with a dye to form a dye-sensitized semiconductive layer; and disposing an electrolyte solution into each of the cavities of the dye-sensitized semiconductive layer.

BRIEF DESCRIPTION OF THE DRAWINGS

Advantages and features of the invention may become apparent upon reading the following detailed description and upon reference to the drawings in which.

DETAILED DESCRIPTION OF SPECIFIC EMBODIMENTS

Figure 1:
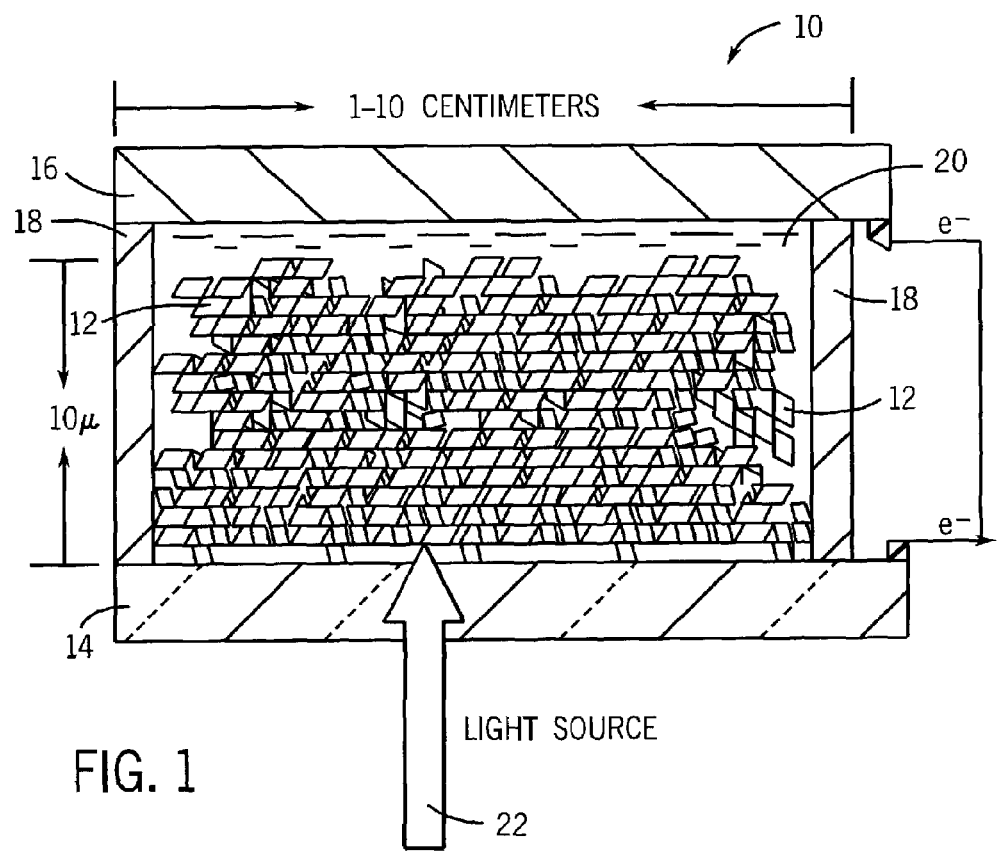
FIG. 1 illustrates a cross-sectional view of an exemplary embodiment of a dye-sensitized solar cell.

FIG. 1 illustrates an exemplary embodiment of a dye-sensitized solar cell 10. As can be appreciated, the solar cell 10 may be constructed by implementing planar layered structures. The solar cell 10 may be fabricated by implementing any one of a number of techniques and using a variety of materials, as can be appreciated by those skilled in the art. In one embodiment, a layer of semiconductor material, such as a layer of nanocrystalline titanium dioxide ($TiO_2$) 12 may be disposed on a transparent substrate 14, such as a glass substrate. The substrate 14 is coated with a conductive layer such as a transparent conducting oxide (TCO) layer. The TCO coated transparent substrate 14 forms the front electrode of the solar cell 10. As can be appreciated, the substrate 14 may comprise other transparent materials such as plastic. The $TiO_2$ layer 12 may be disposed at a thickness in the range of 5–20 microns, for example. The $TiO_2$ layer 12 is generally disposed at a thickness of at least 10 microns to facilitate efficient light absorption, as explained further below. The $TiO_2$ layer 12 of the exemplary solar cell 10 has a thickness of approximately 10 microns, as illustrated in FIG. 1. The $TiO_2$ layer 12 may be sintered, dried and pressed, or chemically modified to provide mechanical strength, electrical conductivity and adherence to the substrate.

A back electrode 16 may be positioned on top of the $TiO_2$ layer 12. The back electrode 16 may be coated with a platinized or carbonized TCO layer. The back electrode 16 may be positioned such that a small space (one micron, for example) is provided between the $TiO_2$ layer 12 and the back electrode 16. Accordingly, minimal contact points (or no contact points, as in the present exemplary embodiment) may exist between the $TiO_2$ layer 12 and the back electrode 16. A seal 18, such as an organic material or glass for instance, is provided to seal the edges of the solar cell 10. As can be appreciated, while the height of the solar cell 10 may be in the range of 5–20 microns, the lateral dimension of the solar cell 10 (i.e. between each of the seals 18) may be in the range of 0.5–10 centimeters, for instance. The lateral dimension of the exemplary solar cell 10 is illustrated as having an exemplary range of approximately 1–10 centimeters, for example.

The back electrode 16 may include filling holes (not shown) through which a solution of dye suitable for sensitizing the titanium oxide layer 12 can be injected. As can be appreciated by those skilled in the art, the dye used to saturate and sensitize the $TiO_2$ layer 12 may include group VIII metal complexes of bipyridine carbonoxylic acids, such as $RU(4,4'\text{-dicarbonxy-2,2'-bipyridyl})_2SCN)_2$, for instance. Once the $TiO_2$ layer 12 is saturated, the dye-coated $TiO_2$ layer 12 may be rinsed and cleaned, as can be appreciated by those skilled in the art. An electrolyte layer 20 is injected through the filling holes in the back electrode 16 to fill the pores in the semiconductor film and the remaining space between the glass substrate 14 and the back electrode 16.

The electrolyte layer 20 facilitates the movement of ions formed by a separation of electrons in the dye sensitized $TiO_2$ layer 12 upon exposure by an incident light source 22, such as sunlight, as explained further below. Finally, the filling holes may be sealed and electrical contact is made between the glass substrate 14 and the back electrode 16.

As illustrated with respect to FIG. 1, the light path through the sensitized $TiO_2$ layer 12 is approximately 10 microns. When an incident light source 22 is directed through the glass substrate 14, the incident light excites electrons within the dye, and the electrons are transferred into the $TiO_2$ layer 12. The electrons migrate through the adjacent crystals in the $TiO_2$ layer 12 through a "random walk." While the maximum distance of any of the particles in the $TiO_2$ layer 12 is approximately 10 microns from the glass substrate 14, the distance an electron may travel through the $TiO_2$ layer 12 to reach the glass substrate 14 may be significantly greater than 10 microns as the electron randomly migrates through adjacent nanocrystals in the $TiO_2$ layer 12. During the random walk of the electron to the glass substrate 14, the electron may be lost by combining with a component of the electrolyte layer 20. In general, the longer it takes for an electron to diffuse through the $TiO_2$ layer 12 to the underlying TCO coated substrate 14, the more likely that the electron will disadvantageously recombine. Under irradiation by sunlight the density of the electrons in the $TiO_2$ layer 12 may be high enough that the losses significantly reduce the maximum voltage and therefore the efficiency achievable by the solar cell 10. As previously discussed, reducing the thickness of the $TiO_2$ layer 12 to reduce the likelihood of electron recombination during the random walk (thereby decreasing the migration path of the electrons) is disadvantageous, because reducing the thickness of the $TiO_2$ layer 12, reduces the light absorption potential of the $TiO_2$ layer 12.

Further, ions formed by reaction of components of the electrolyte with oxidized dye molecules which have injected electrons into the semiconductor, here $TiO_2$ layer 12, migrate to the back electrode 16 through the electrolyte 20 to complete the circuit. Because the TiO2 layer 12 is "porous" and therefore comprises a continuous system of pores, ions in the electrolyte 20 can diffuse through the TiO2 layer 12. In the present exemplary embodiment, the maximum distance from any ion to the back electrode 16 is the thickness of the $TiO_2$ layer 12 plus the additional space between the $TiO_2$ layer 12 and the back electrode 16. In the present exemplary embodiment, the maximum distance from any ion to the back electrode is approximately 11 microns. As previously described, the electrolyte layer 20 is typically an organic solvent. While polar, stable and non-viscous solvents are desirable, the solvents implemented in the solar cell 10 such as acetonitrile, are generally volatile. Generally speaking, less volatile solvents are more viscous and impede the diffusion of ions to the point where the diffusion limits the power output and therefore the efficiency of the solar cell 10. In solar cells 10 implementing a plastic substrate 14, the loss of volatile solvents may create even more of a problem.

In summary, the solar cell 10 of FIG. 1 includes a $TiO_2$ layer 12 coated with dye and disposed at a thickness of about 10 microns onto a TCO coated planar substrate 14. A platinized TCO coated glass substrate forms the back electrode 16. The $TiO_2$ layer 12 is in direct contact with the glass substrate 14 to provide an electrical connection for the excited electrons, and the contact area is advantageously maximized to provide increased electron paths through the $TiO_2$ layer 12 to the substrate 14. Conversely, the contact area between the $TiO_2$ layer 12 and the back electrode layer 16 is minimized and in the present exemplary embodiment, does not exist (i.e. the $TiO_2$ layer 12 is electrically isolated from the electrode layer 16). The shortest light path through the $TiO_2$ layer 12 is 10 microns. Although longer light paths may be desirable to provide more light absorption, the losses due to increased recombination and from ion diffusion limitations make thicker layers of the solar cell 10 less efficient.

Figure 4:
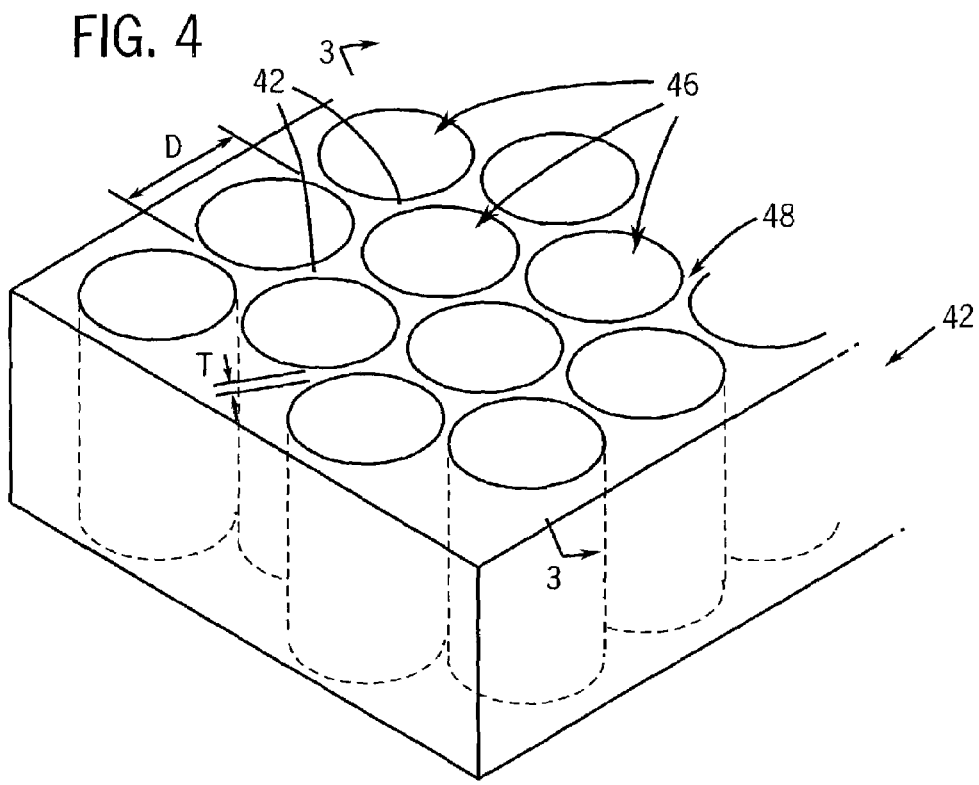
FIG. 4 illustrates a top plan view of an exemplary nano-honeycomb electrode.
Figure 2:
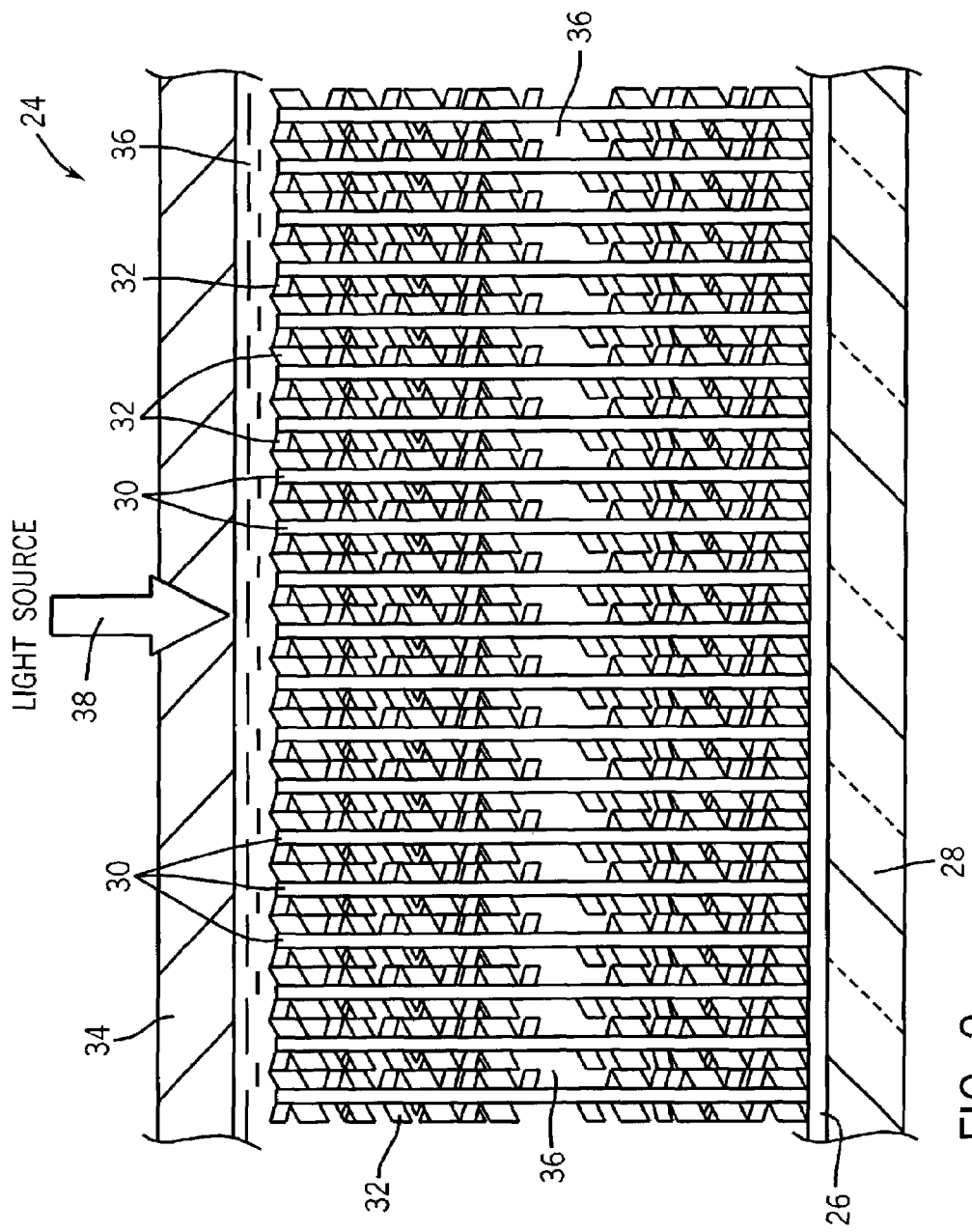
FIG. 2 illustrates a cross-sectional view of an exemplary embodiment of a solar cell having nanowire electrodes in accordance with the present techniques.
Figure 3:
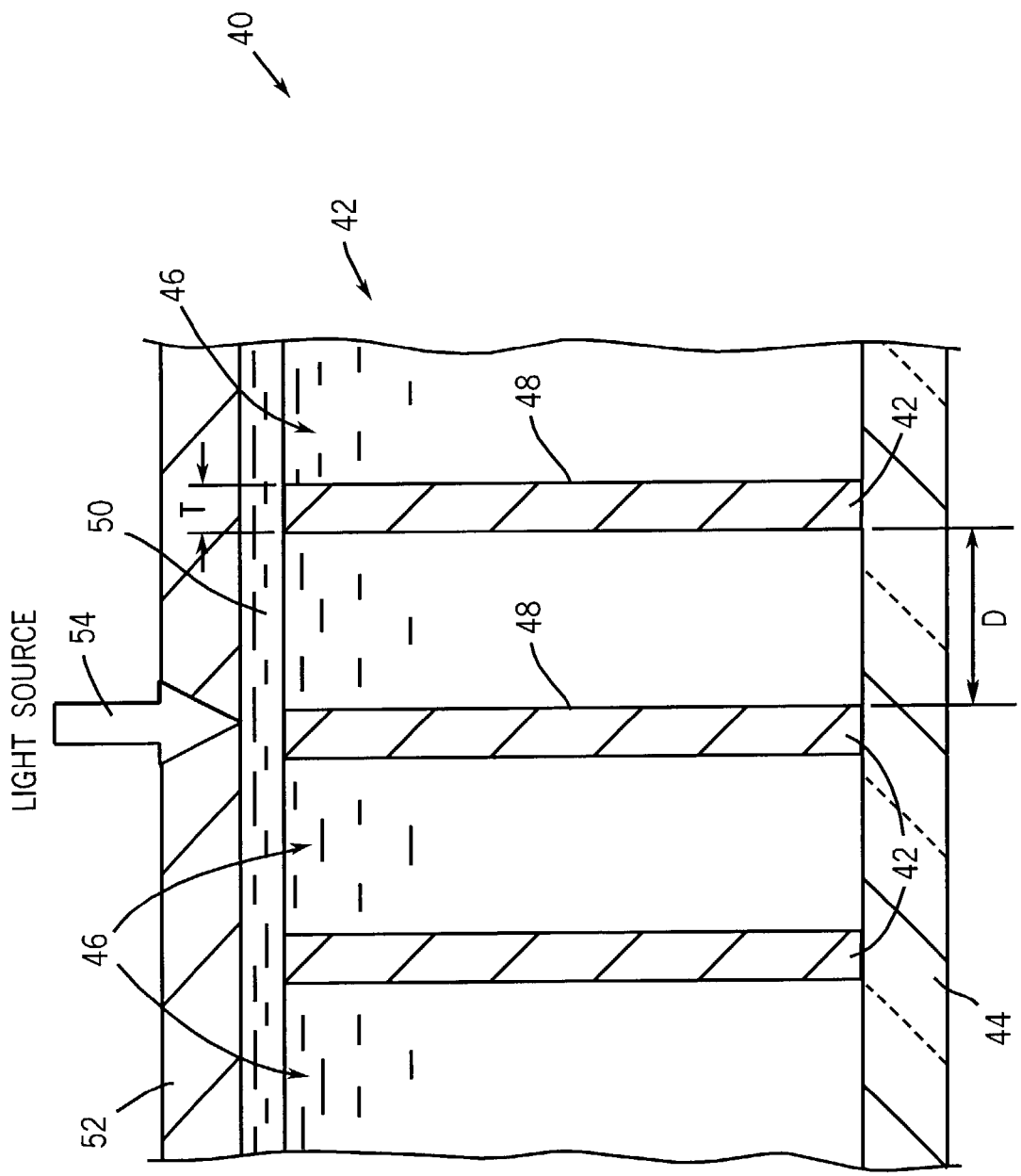
FIG. 3 illustrates a cross-sectional view of an exemplary embodiment of a solar cell having nano-honeycomb electrodes in accordance with the present techniques.

FIGS. 2–4 illustrate improved solar cells fabricated in accordance with the present techniques. Generally speaking, metal foil is structured to form an electrode and to provide a reduced electron path length through the semiconductor material to the electrode and/or a reduced ion path length through the electrolyte to the platinized or carbonized electrode. Advantageously, the present techniques may reduce recombination losses and may reduce diffusion losses in the electrolyte, thereby increasing the efficiency of the solar cell. Because the efficiency of the solar cell is a major consideration in the cost of the power produced by the cells, the present techniques advantageously reduce the cost per watt delivered as well.

Referring specifically to FIG. 2, a cross-sectional view of a solar cell 24 implementing a first embodiment of an electrode fabricated in accordance with the present techniques is illustrated. The solar cell 24 includes a first electrode 26 having a planar portion disposed on a substrate 28. The substrate 28 may comprise glass, for example. The planar portion of the first electrode 26 comprises a metal foil. The metal foil is advantageously resistant to iodine corrosion such that the structural integrity of the first electrode 26 is not degraded by the electrolyte solution in the solar cell 24. In one exemplary embodiment, the planar portion of the first electrode 26 comprises titanium (Ti). As can be appreciated, other suitable metals such as Mo-based steels, high silicon-based steels, stellite 6, hastelloy C, stainless steels 304, 309, 316 and 317, niobium, tantalum or molybdenum, may also be used.

The first electrode 26 also comprises a plurality of nanowires 30 extending from the surface of the planar portion of the first electrode 26. The nanowires 30 comprise a conductive metal foil structured to form the nanowires 30 which extend from the planar portion of the first electrode 26. While the nanowires 30 of the exemplary embodiment illustrated in FIG. 2 comprise structures extending approximately perpendicular to the planar portion of the first electrode 26, the nanowires 30 may extend from the planar portion in a non-perpendicular configuration. For example, in an alternate embodiment, each nanowire 30 may extend in a random direction and may come in contact with adjacent nanowires 30. Further, the nanowires 30 may form a tangled structure, resembling a bird's nest, for instance.

The nanowires 30 may comprise the same material as the planar portion of the first electrode 26, for example. Alternatively, the nanowires 30 may comprise a different conductive metal than the material used for the planar portion of the first electrode 26. In the present exemplary embodiment, the nanowires 30 comprise titanium (Ti). The nanowires 30 have a width in the range of approximately 10–50 nm and a length in the range of 1–50 microns, for example. The spacing between the base of each of the nanowires 30 (i.e. the point at which the nanowire 30 intersects the planar portion of the first electrode 26) may be in the range of approximately every 20–800 nanometers.

The nanowires 30 and the planar surface of the first electrode 26 are coated with a semiconductor material 32 such as titanium oxide ($TiO_2$). The semiconductor material 32 generally comprises a nanocrystalline material comprising crystalline particles having a diameter of in the range of approximately 10–400 nm. The planar surface of the first electrode 26 and the nanowires are coated with a layer of the semiconductor material 32 that may be approximately 1–2 crystals thick (i.e. approximately 10–400 nm). In the present exemplary embodiment where the first electrode 26 comprises titanium, the $TiO_2$ layer (semiconductor material 32) may be formed by direct oxidation of the first electrode 26. The first electrode 26 may be oxidized by electrochemical means, for example. Advantageously, electrochemical oxidation facilitates the complete oxidation of the entire surface of the planar portion of the first electrode 26 and the nanowires 30, thereby forming a surface free of pinholes. While it may be advantageous to completely cover the first electrode 26 with the semiconductor material 32, the surface may include voids in the semiconductor material 32 where the underlying conductive nanowires 30 are exposed, as illustrated in FIG. 2.

The solar cell 24 also includes a second electrode 34. The second electrode 34 may comprise TCO disposed on a transparent substrate such as glass, for example. The second electrode 34 is platinized or carbonized to provide a catalyst for the triiodide ions produced from the reduction/oxidation of the dye ions produced after excitation of electrons in the dye. Once the nanocrystalline semiconductor material 32 is disposed or formed on the first electrode 26, a dye may be introduced to saturate the $TiO_2$ surfaces and provide a dye-coated semiconductor material 32. Next, an electrolyte solution 36, which may comprise an iodide/triiodide couple, for example, is injected into the solar cell 24 to fill the remaining pores and voids between the nanocrystalline particles of the semiconductor material 32. As can be appreciated, an ecapsulant (not shown) may be provided to hermetically seal the solar cell 24 to provide protection from external elements.

One exemplary technique for forming the nanowires 30 is to implement a commercially available plastic sheet, such as a sheet of polycarbonate polymer, having a thickness approximately equal to the desired length of the nanowires 30 (e.g. 1–50 microns). The plastic sheet may be disposed on the planar portion of the first electrode 26, exposed to neutrons and treated with a solvent, thereby forming a plurality of holes or pores through the plastic sheet and to the underlying planar portion of the first electrode. Alternatively, the holes or pores may be created prior to disposing the plastic sheet onto the first electrode 26. Each of the holes may have a diameters in the range of approximately 10–50 nm. A metal, such as titanium (Ti) may then be disposed in the holes of the plastic sheet by electro-deposition, for example, thereby forming the nanowires 30. The plastic sheet may then be dissolved by a chemical rinse, for example, thereby leaving only the nanowires 30 extending from the planar surface of the first electrode 26. The first electrode 26 may be oxidized to electro-chemically grow the semiconducting crystals (here $TiO_2$) on the surface of the nanowires 30 and the planar portion of the first electrode 26 to form the semiconductor material layer 32. Alternatively, the semiconductor material 32 may be disposed on the first electrode 26 by chemical vapor deposition, for example. Further, even if the semiconductor material 30 is electrochemically grown, additional semiconductor material 32 may be disposed to provide more semiconductor surface area (for better light absorption) between the nanowires 30. After the injection and washing of the dye and the introduction of the electrolyte solution, the structure illustrated with respect to FIG. 2 is achieved.

The exemplary embodiment illustrated in FIG. 2 and implementing nanowires 30 advantageously provides a reduced electron path. As previously described with reference to FIG. 1, when an incident light source 38 is directed through the second electrode 34, electrons are excited in the dye. The excited electrons travel through the nanocrystalline semiconductor material 32 to the first electrode 26 by a random walk. As can be appreciated, by implementing a first electrode 26 having nanowires 30, the travel distance of the excited electrons may be greatly reduced as compared to the exemplary solar cell 10 illustrated in FIG. 1. Specifically, because the dye-coated nanocrystals of the semiconductor material 32 are located no more than 10–400 nanometers from the closest nanowire 30 (i.e. approximately half of the spacing between adjacent nanowires 30) in the solar cell 24, as compared to approximately 10 microns as in the solar cell 10 of FIG. 1, the time it takes the electron to travel to the first electrode 26 may be dramatically reduced. Advantageously, the reduction in the electron path, and hence, the time it takes an excited electron to reach the first electrode 26, reduces the likelihood of recombination.

FIGS. 3 and 4 illustrate an alternate exemplary embodiment of the present techniques. Referring specifically to FIG. 3, a cross sectional view of a solar cell 40 is illustrated. The solar cell 40 includes a first electrode 42 disposed on a substrate 44, such as glass. The first electrode 42 may originally comprise a metal foil layer such as titanium (Ti) or zinc (Zn), for example. The metal foil may have a thickness in the range of 1–50 microns, for example. When the metal foil is oxidized, electrochemically for example, a closely packed array of cavities 46 or holes is formed through the metal foil. The cross-sectional shape of the cavities may be cylindrical, for example. The shape of the cavity 46 may vary depending on the oxidation technique implemented. Further, the arrangement of the cavities 46 with respect to adjacent cavities 46 may be that of a hexagonal close packed array. That is to say that each cavity 46 shares a wall 48 with six surrounding cavities 46.

As can be appreciated, the oxidation of the metal foil not only produces an array of cavities 46, but also converts the metal into a semiconductor layer. For instance, if the first electrode 42 originally comprises a titanium (Ti) foil layer, when the titanium (Ti) foil layer of oxidized, the cavities 46 are formed and the titanium foil is converted to a titanium oxide ($TiO_2$). Accordingly, once the titanium foil layer has been oxidized, the first electrode 42 comprises a crystalline titanium oxide ($TiO_2$) layer having cavities 46 therethrough, separated by walls 48. In the present exemplary embodiment, the walls 48 are converted to titanium oxide ($TiO_2$) completely during the oxidation process. Alternatively, it may be advantageous to oxidize the metal foil layer such that the walls 48 of the first electrode 42 retain a titanium (Ti) core having a layer of titanium oxide ($TiO_2$) formed on the walls 48 of the cavities 46. That is to say, the metal foil layer is not completely oxidized, such that an inner core of titanium (Ti) remains within the walls 48 of the first electrode 42.

The first electrode 42 is further illustrated by the top plan view illustrated in FIG. 4. Accordingly, the following discussion is best understood with reference to FIGS. 3 and 4. As previously described, in one exemplary embodiment, a titanium foil is disposed on the substrate 44. During an electrochemical oxidation process, pores or cavities 46 separated by walls 48 are formed through the titanium foil, and the titanium foil is converted to titanium oxide, thereby providing the first electrode 42 of the solar cell 40. In the present exemplary embodiment, the diameter D of each cavity 46 may be in the range of approximately 10–400 nm, for example, and the thickness T of the walls 48 separating each cavity 46 may be in the range of approximately 2–40 nm, for example.

By providing an array of cavities 46, the surface area or surface roughness factor is increase dramatically. For example, a 10 micron thick sheet of titanium (Ti) foil having cavity diameters D of approximately 20 nm and wall thicknesses T of approximately 5 nm may produce a surface roughness factor of approximately 1000 per square meter. That is to say that the surface area of the sheet is increased by approximately 1000×. If the cavity diameters D are approximately 20 nm and the wall thicknesses T are approximately 20 nm, the surface roughness factor may be approximately 400 per square meter, for example. A surface roughness factor of approximately 300–1000 advantageously provides sufficient dye coating surface area to facilitate effective absorption of solar energy.

Once the metal film is oxidized to form the semiconducting layer of titanium oxide ($TiO_2$), a dye may be introduced to saturate the $TiO_2$ surfaces and provide a dye-coated layer of crystalline titanium oxide ($TiO_2$). Next, an electrolyte solution 50, which may comprise an iodide/triiodide couple, for example, is injected into the solar cell 40 to fill the cavities 46 in the first electrode 42 and the remaining pores and voids between withing the titanium oxide ($TiO_2$) material.

The solar cell 40 also includes a second electrode 52. The second electrode 52 may comprise TCO disposed on a transparent substrate such as glass, for example. The second electrode 52 is platinized or carbonized to provide a catalyst for the triiodide ions formed by reaction of components of the electrolyte solution 50 with dye molecules that have been injected into the semiconductor material during exposure to incident light. As can be appreciated, an encapsulant (not shown) may be provided to hermetically seal the solar cell 40 to provide protection from external elements.

The exemplary embodiment illustrated in FIGS. 3 and 4 provides several advantages over the solar cell 10 illustrated in FIG. 1. The present solar cell 40 advantageously provides a reduced electron path. As previously described, when an incident light source 54 is directed through the second electrode 52, electrons are excited in the dye. The excited electrons travel through the titanium oxide ($TiO_2$) walls 48 of the first electrode 42 by a random walk. As can be appreciated, the travel distance of the excited electrons may be greatly reduced as compared to the exemplary solar cell 10 illustrated in FIG. 1. Specifically, because of the nano-honeycomb structure of the first electrode 42, the path of the electrons to the underlying oxide layer may be more controlled and better defined. This eliminates or reduces some of the random migration of the electrons and hence reduces the electron travel path. Further, if a core layer of titanium (Ti) is left within the walls 48, the electron migration may be further improved because the layer of titanium oxide ($TiO_2$) is grown directly on the underlying titanium surface of the walls 48, and contact between the layer of titanium oxide ($TiO_2$) and the underlying titanium is optimal throughout the structure. Accordingly, the time it takes the electron to travel from the layer of titanium oxide ($TiO_2$) to the underlying titanium of the first electrode 42 may be dramatically reduced. Advantageously, the reduction in the electron path and hence the time it takes an excited electron to reach the TCO coated substrate 14 reduces the likelihood of recombination. Further since the layer of titanium oxide ($TiO_2$) is formed from a sheet of titanium foil, no sintering process is needed, thereby reducing the steps for fabricating the solar cell 40.

Another advantage of the present embodiment is that the ion transport in and out of the cavities 46 may be much quicker than through the torturous paths that may exist due to the typical random arrangement of crystallites in the layer of nano-crystalline titanium oxide ($TiO_2$). A further advantage is that the surface chemistry may be well controlled and better defined using electrochemical oxidation rather than chemical vapor deposition to provide the semiconductor material (i.e. the layer of titanium oxide ($TiO_2$)). That is to say that the surface dangling bonds, functionalities and states are most likely limited and easy to characterize, thereby providing more control of the dye orientation and coverage, as can be appreciated by those skilled in the art. Yet another advantage is that the present exemplary embodiment provides a more precise control of the optical path length by controlling the thickness of the titanium (Ti) foil used to form the first electrode 42. Still a further advantage is that the thickness of the layer of titanium oxide ($TiO_2$) can be controlled to allow maximum cell potential and short circuit current to be achieved.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A solar cell comprising:
    a first planar electrode comprising a transparent material;
    a second electrode electrically isolated from the first electrode and comprising a conductive sheet, the conductive sheet having an array of substantially cylindrical cavities formed therethrough; and
    a porous dye sensitized semiconductor material disposed within the array of cavities and electrically coupled to the second electrode.

2. The solar cell, as set forth in claim 1, wherein the second electrode comprises a planar portion parallel to the first electrode and wherein the conductive sheet comprises a titanium foil layer.

3. The solar cell, as set forth in claim 1, wherein the conductive sheet has a thickness in the range of approximately 1–50 microns, and wherein the dye sensitized semiconductor material is formed in each of the plurality of cavities.

4. The solar cell, as set forth in claim 3, wherein each of the plurality of cavities comprises a diameter in the range of approximately 10–400 nm.

5. The solar cell, as set forth in claim 3, wherein the thickness of the walls of each of the plurality of cavities is in the range of approximately 2–40 nm.

6. The solar cell, as set forth in claim 3, comprising an electrolyte solution disposed in each of the plurality of cavities.

7. The solar cell of claim 1, wherein the array of cavities of the conductive sheet comprises a hexagonal close packed array.

8. The solar cell of claim 1, wherein the conducive sheet comprises a 10 micron thick sheet of titanium foil.

9. A solar cell comprising:
a first electrode including a conductive sheet, the sheet having a plurality of substantially cylindrical cavities extending therethrough;
a second electrode electrically isolated from the first electrode and positioned approximately parallel to the sheet of the first electrode;
a porous dye sensitized semiconductor layer formed on the surface of the outer walls of the cavities of the first electrode; and
an electrolyte solution filling the plurality of cavities and adjacent the semiconductor layer.

10. The solar cell, as set forth in claim 9, wherein the first electrode comprises titanium (Ti) and the porous dye sensitized semiconductor layer comprises titanium oxide ($TiO_2$).

11. The solar cell of claim 9, wherein the diameter of each of the plurality of cavities is in the range of approximately 10–400 nm.

12. The solar cell of claim 9, wherein the plurality of cavities are arranged in a hexagonal close packed array.

* * * * *